Figure 1:
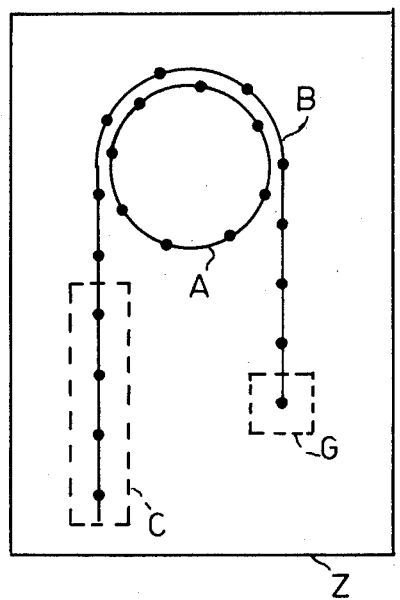

United States Patent [19]
van Suchtelen

[11] 4,027,296
[45] May 31, 1977

[54] MAGNETIC PLATE COMPRISING DRIVABLE DOMAINS

[75] Inventor: Jaap van Suchtelen, Eindhoven, Netherlands

[73] Assignee: U.S. Philips Corporation, New York, N.Y.

[22] Filed: Dec. 12, 1974

[21] Appl. No.: 532,260

Related U.S. Application Data

[63] Continuation of Ser. No. 390,592, Aug. 22, 1973, abandoned.

[30] Foreign Application Priority Data

Sept. 2, 1972 Netherlands ............... 7212008

[52] U.S. Cl. .................. 340/174 TF; 340/174 VA
[51] Int. Cl.² ......................................... G11C 11/14
[58] Field of Search ................ 340/174 TF, 5 R

[56] References Cited

UNITED STATES PATENTS

| 3,613,058 | 10/1971 | Bonyhard | 340/174 TF |
| 3,641,518 | 2/1972 | Copeland | 340/174 TF |
| 3,676,872 | 7/1972 | Lock | 340/174 TF |
| 3,737,882 | 6/1973 | Furuoya | 340/174 TF |
| 3,760,386 | 9/1973 | Quadri | 340/174 TF |
| 3,806,901 | 4/1974 | Buhrer | 340/174 TF |
| 3,958,211 | 5/1976 | Suchtelen | 340/174 TF |

OTHER PUBLICATIONS

IBMTDB, "Using Bubble Lattice Wave Motion as a Shifting Mechanism," by Bpgholtz, et al., vol. 13, No. 9, 2/71, p. 2738.

Primary Examiner—James W. Moffitt
Attorney, Agent, or Firm—Frank R. Trifari; Carl P. Steinhauser

[57] ABSTRACT

A magnetic bubble memory employing first and second domain paths. Domains (bubbles) driven by external means in the first path drive those in the second path producing analogs of gearwheels, cam wheels, ratchets, and even an "electronic light newspaper".

10 Claims, 9 Drawing Figures

MAGNETIC PLATE COMPRISING DRIVABLE DOMAINS

This is a continuation of application Ser. No. 390,592, filed Aug. 22, 1973, now abandoned.

The invention relates to a plate of magnetic material, comprising at least one first and one second path along which domains can be driven, the second path comprising a separate drive unit. The said plate has a preferred magnetization orientation which extends transverse to the plane of the plate.

Suitable magnetic materials are mentioned, for example, in the article "Materials for magnetic bubbles" by R.A. Laudise and L.G. van Uitert, Bell Laboratories Record, September 1971, pages 239–243.

Hereinafter, the term domain is to be understood to mean an area in the plate which has a magnetization direction which is opposed to that of the magnetic field when a given magnetic field is applied transverse to the plate. This area can have the shape of a disc (a so-termed bubble), but other shapes have also been found.

Many displacement means are known for the displacement of domains in such a plate of magnetic material. They can be displaced by means of electric (pulse) currents, but in that case a domain guide structure of wire loops is required. Furthermore, domains can be displaced along guide structures of, permalloy (T-bar and Y-bar structures), where rotating field components occur in the plane of the plate. Another method is the use of so-termed "angelfish" guide structures of permalloy, in combination with a fluctuation in the time of the field transverse to the plate.

If the driving forces are sufficiently strong, the domains can be driven along prescribed paths. A special property of many of these paths is that the domains cannot pass each other on such a path as a result of the repulsion which always occurs between neighbouring domains. The same applies to "rail"-like paths which are not composed of discrete elements in their longitudinal direction. Thereon, a single domain can retain, in the absence of other domains, one degree of freedom for movement along the path. Such a path can consist of a strip of permalloy on the plate or of one or more grooves in said plate.

These structures produce elongated potential drops for the domains along the paths; this implies that energy is required for moving the domains in a direction transverse to such a path. Domains can be driven by a separate drive system, for example, a combination of pulse currents in wire loops or by means of an angelfish structure. Furthermore, the domains drive each other along said one path due to the repulsion. This can be considered as each domain causing a potential crest in its vicinity which is superimposed on the external potential field.

A separate drive unit may be undesirable in view of a lack of space or in view of the interference caused thereby. This drawback is avoided according to the invention wherein along at least one first part of said first path a domain can be driven by an interaction force with domains which are driven by said separate drive unit along a second part of the second path which is arranged alongside said first part. If the parts which are arranged alongside each other are sufficiently near to each other, the potential crests of the domains extend so far that the domains on the adjacent path cannot pass. This is particularly applicable if the paths extend continuously in the longitudinal direction. The domains can then be continuously driven because they had the already described degree of freedom without said drive. Therefore, it is only necessary that forces caused by local disturbances in the plate or path structure are smaller than forces between the domains themselves. This is quite feasible if the parts which are arranged alongside each other are spaced 1 to 3 domain diameters apart. It is to be noted that the separate drive unit can also consist of a drive system with two path parts according to the invention which are arranged alongside each other. U.S. application Ser. No. 277,150, filed Aug. 2, 1972, now U.S. Pat. No. 3,944,842 describes the driving of domains along a second path by displacement of domains along a first path. However, according to that application the paths are situated in different plates, which results in a complex construction. Furthermore, therein the domains on adjoining plates attract each other while according to the present invention they repel each other. It is possible, however, to combine a device according to the present invention with a multi-plate structure. In one embodiment of the invention, the domains on the first path are arranged to be substantially equidistant. This means that any differences in distance do not contain information and that the drive system thus forms an analogon of a mechanical drive system as will be described hereinafter.

In another embodiment of the invention at least one of said two paths forms a closed figure. In this manner, a drive similar to that of a gear-wheel is achieved so that uninterrupted rotation is possible.

In still another embodiment of the invention, the first path comprises means for realizing a clicking device in the form of a stable domain position, or that said first path comprises asymmetrical means for realizing a ratchet device in the form of a stable domain position. The number of functions of a plate according to the invention is thus increased.

In still another embodiment of the invention the second path comprises a switching unit along which domains can be alternatively driven as a detour about said second part. In accordance with the position of the switching unit, the first path can then be driven or uncoupled, without the movement of the domains along the second path being interrupted.

In another embodiment of the invention the first and second parts cover the entire length of the closed first and second paths, the number of domains on the first path being smaller than the number of domains on the second path. The analogue of cam discs is thus realized.

In still another embodiment of the invention a domain can be driven along a third part of a third path, arranged alongside a fourth part of said first path, by a domain which is driven along said fourth part, but which can slip with respect to domains driven along said second part. The driving force is thus readily derived from such cam discs.

In a further embodiment of the invention the first path forms part of a number of paths which extend together, a pattern generator being provided by means of which a domain pattern can be generated which can be driven by an interaction force of the domains driven along said number of paths and by the domains on said second path. In this manner a large quantity of information can be transported along only a few paths.

In a still further embodiment the characteristic dimensions of the pattern are proportioned so as to be visually distinguishable. Single domains are generally too small to be distinguishable; by forming patterns of larger characteristic dimensions, they can be made visible without further magnification. Moreover, the image can thus be readily transported so that the analogue of an "electronic light newspaper" i.e. moving character display is obtained.

Figure 2:
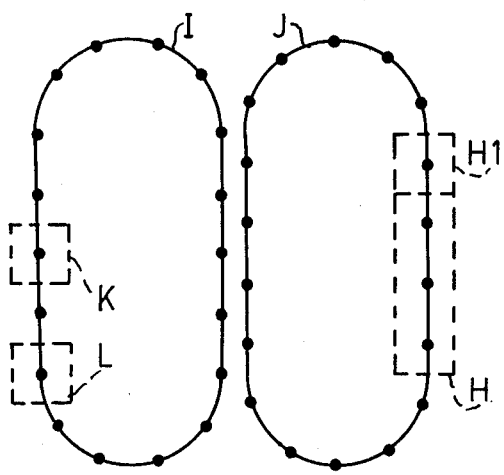
Figure 3:
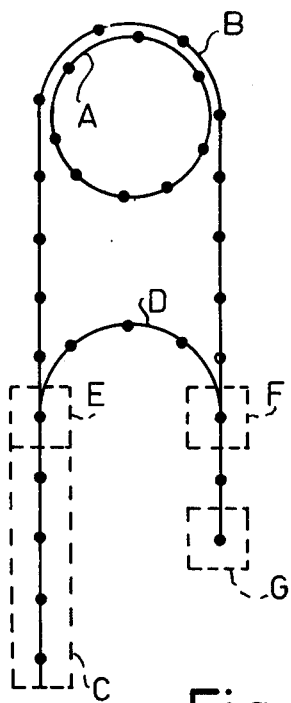
Figure 4:
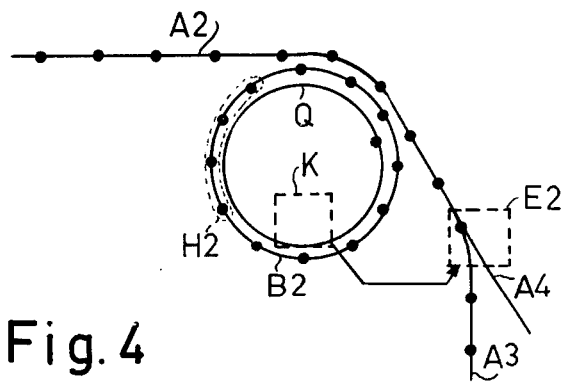
Figure 5:
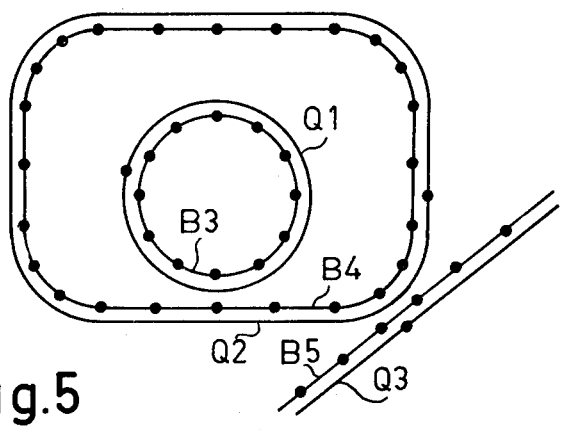
Figure 6:
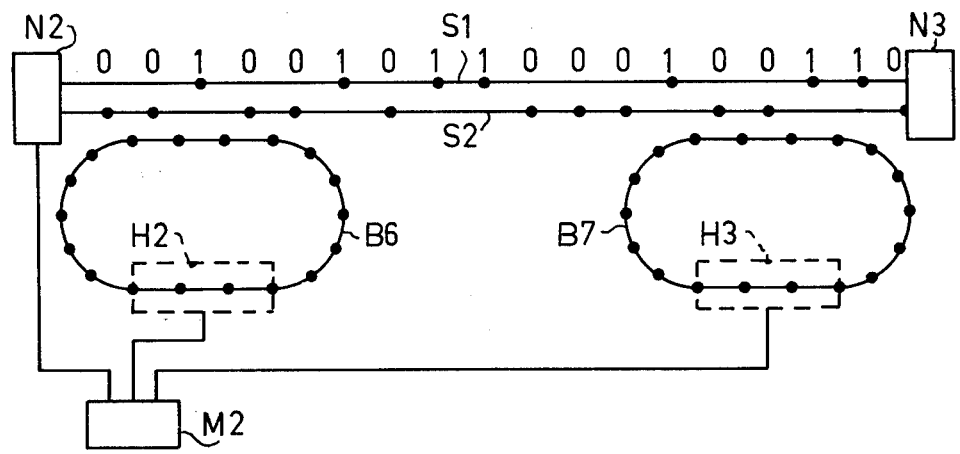
Figure 7:
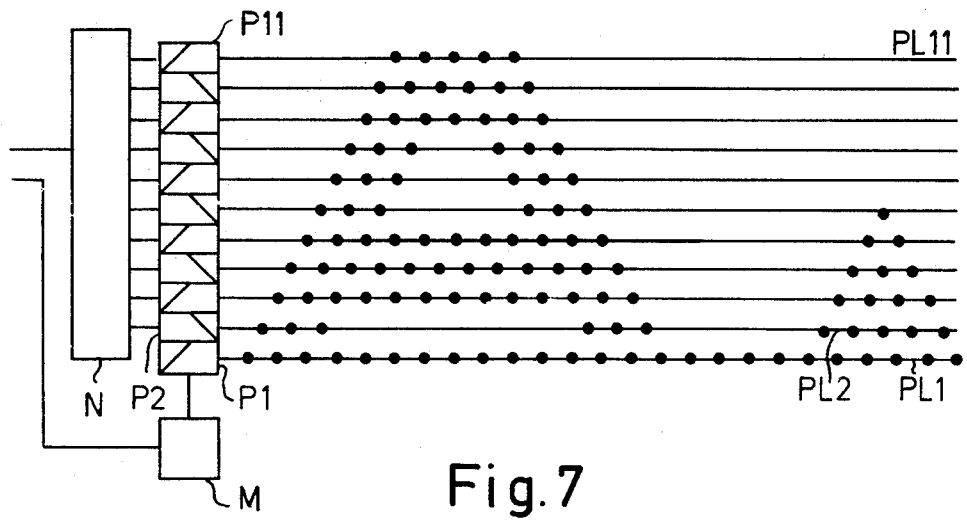
Figure 8:
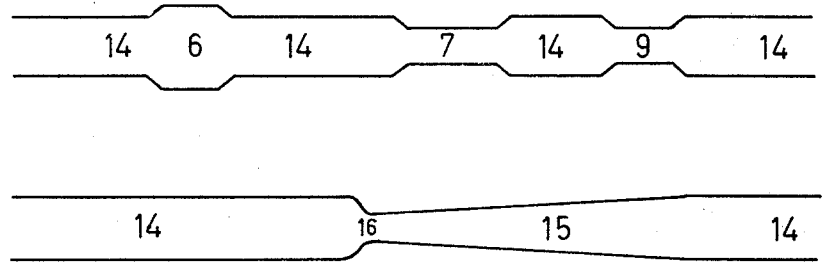
Figure 9:
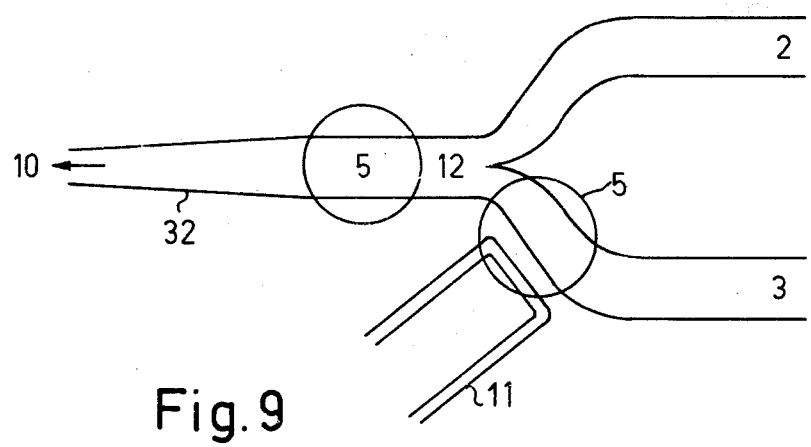

The invention will be described in detail hereinafter with reference to some figures:

FIG. 1 shows an example comprising two paths;
FIG. 2 shows another example comprising two paths;
FIG. 3 shows an example comprising two paths and a switch;
FIG. 4 shows an example of domain logic;
FIG. 5 shows an example of a counter;
FIG. 6 shows the transport of a domain pattern;
FIG. 7 shows a pattern which is proportioned according to human vision strength;
FIG. 8 shows clicking and ratchet devices;
FIG. 9 shows a switching unit.

The structure of a single domain will not be described herein because this has been described already. Merely the driving and the relevant aspects of the domains will be discussed. FIG. 1 shows an example of two paths A and B which are denoted by thin lines and along which the domains denoted by dots can be displaced. A domain has a magnetization direction which opposes that of the remainder of the plate Z, and if no further steps are taken, a domain in the plate is substantially in a two-dimensional stable equilibrium. Two effects, now exist. First of all, neighbouring domains repel each other. This is very noticeable up to a distance of a few domain diameters. Secondly, the domains tend to center on a path. The domains will arrange themselves roughly so as to be equidistant on the two paths, the domains being alternately arranged on the parts which are arranged alongside each other. C denotes a drive and generating unit for domains, which G denotes a domain destruction unit. If G and C operate synchronously, the alternating arrangement will be maintained, and the domains on path A will also be driven. The domains on the parts of the paths which are arranged alongside each other can be continuously driven, even though the operation of the units C and G can also be discontinuous.

For example, the following quantitative data can be applicable for a given case: the plate is made of ytterbium orthoferrite having a thickness of 0.05 mm. The magnetic field is 50–70 oersted, and the diameter of the disc-like domains is 0.1–0.2 mm. The paths are formed by permalloy strips having a width of 0.06 mm and a thickness of 0.001 mm. The center-to-center distance between the adjacently arranged parts of the strips is 0.25 mm. The intervals between the domains on the same path very between 0.4 and 0.6 mm. A larger value applies if on the other path a domain is arranged between two domains on the one path, and a smaller value applies if this is not so, for example, if no two adjacently arranged path parts are present at this area.

FIG. 2 shows an example of two closed paths I and J which are adjacently arranged over a straight portion. Driving is effected by means of the unit H, while the unit H1 is capable of destroying and/or generating domains. The transmission ratio of the paths I and J which act as gear-wheels can thus be changed. The element K detects passing domains like a revolution counter. The unit L can also destroy and/or generate domains. If the number of domains on path J becomes larger, the number of domains on a part which is not arranged alongside a part of path I can become, for example, approximately 20% larger. In the part which is arranged alongside a part of path I the variation will be smaller, for example, 5%. If the number of domains on the path I becomes too large, it will no longer be possible to arrange them in an alternating manner with the domains on the path J in adjoining parts. It may then be that between some pairs of domains on path J two domains are situated on the corresponding adjoining part of path I. If the number of path I becomes approximately 36, the domains can each time be arranged according to a 2-1-2-1 pattern. The interaction forces may then be sufficient for driving, be it that twice as many domains pass the unit K than the unit H. Also in this case, the number of domains on the path I need not be exactly 36 but may vary, for example, between 33 and 40. Similarly, the number of domains on path I can be approximately 9. It may be that at given number of domains the interaction forces compensate for each other such that no driving occurs.

FIG. 3 shows an example of two paths with a switch. The unit E comprises a switch which causes the domains originating from the unit C to follow either the path B or the path D. In the first case, only the domains on path A are driven. Via the unit F, the domains reach the unit G again. The units E and F will be described in detail with reference to Figure 9. The driving can thus be uncoupled. It may be necessary to incorporate additional steps against braking by the domains on the non-driven parts: the part B or D, respectively, depending on the switch position; this step can consist in the taking along of one or more domains by the flow of domains to the unit G.

FIG. 4 shows an example of logic driven by domains. The unit H2 drives the domains along the path B2, and the domains on the path A2 which is arranged adjacent to path B2 are also driven by the interaction forces between the domains. These driven domains can be driven, via the unit E2, a switch, either to path A3 or to path A4. On path Q only one domain (but this is arbitrary) is present which is driven by the domains on path B2. If this domain passes the detector K, it is detected and the unit E2 receives a signal. For example, the unit E2 can be switched over thereby. The flow of domains along the path A2 can thus be distributed over the paths A3 and A4. A more complex distribution can be obtained by means of two domains on path Q, with the result that the distribution of the domains over the paths A3 and A4 can be effected, for example, in the ratio 1:2. The function of path Q is analogous to that of a cam disc.

FIG. 5 shows an example of a counter comprising three stages. The path B3 contains 12 domains and these are driven in a manner which will not be further described. The path Q1 contains one domain which is driven by the domains on path B3. The path B4 contains 24 domains which are all driven by the domain on path Q1. Due to the larger distance with respect to the domains on path B3, slip occurs with respect to these domains and those on B4. At each revolution of the domain on path Q1, the domains on path B4 are shifted forward one location. The displacement speed of the domains on path B4 is 12 times smaller than that on path B3, the circulation speed being even 24 times smaller. The path Q2 contains one domain which is driven by the domains on path B4. Path B5 contains a non-specified number of domains which are driven by the domains on path Q2. The displacement speed of the domains on path B5 is therefore 12 × 24 = 288 times lower than that on path B3. Path Q3 again contains a single domain by means of which domains of a next path can be driven. Other counting speeds are realized when other numbers of domains are present on the path B . . . Q . . .

FIG. 6 shows an example of the transport of a domain pattern. The unit comprises a pattern generator N2, a decoder N3, a control unit M2, two drive units H3 and H2 for ring paths with domains B6 and B7, and two paths for domains S1 and S2. Information can arrive on an input of the pattern generator N2 which is not further shown. This generator subsequently supplies domains with the result that a binary pattern is generated; to this end, the generator can comprise a variety of converters such as a decimal-to-binary converter, an analog-to-digital converter, etc. A domain on path S1 signifies, for example, a binary "0" and a domain on path S2 a binary "1". The domains on path S2 are driven by the domains on the paths B6 and B7. The domains on path S1 are driven by the domains on path S2. On the part between the paths B6 and B7 the domains on paths S1 and S2 drive each other.

A few problems remain. First of all, the information may contain too many "1's" with the result that the driving force becomes too weak. This can be remedied by coding, and such codes have already been used. An example is the following rule: if four 1's successively occur, the next bit is used as a safety bit and is rendered "0".

An additional path corresponding to the drive path B6 can alternatively be used on the other side of the paths S1 and S2. This additional path must then be driven in synchronism with the path B6, but in an opposite sense.

Another problem is that the positions of the domains at the area of the driving paths B6 and B7 are fixed to the locations of the domains on these paths. On the average, the domains on the paths S1 and S2 could then be nearer to each other. If there are enough domains, they will do so in the central part of FIG. 6, but this is not necessarily so, which demonstrates that the central part of FIG. 6 acts as a buffer store with a variable information density. The second driving path can then be used as a synchronization means for the decoder which decodes the information and possibly converts it, for example, into an analog signal.

The pattern on the paths S1 and S2 shown in FIG. 6 can be made visible, for example, by Faraday rotation. This pattern cannot be seen by the naked eye because the domains are too small. Therefore, FIG. 7 shows a pattern of larger proportions: the information arrives at a pattern generator N. Synchronization information is received by the clock pulse generator M, by which the domain generators P1 . . . 11 can be activated. These generators can each time be activated in an alternating manner, i.e., for example, first the even domain generators and then the odd domain generators. The driving force for the entire pattern is delivered by the domains on the path PL1. The pattern must satisfy given topological requirements in order to maintain uninterrupted coherence. This drawback can be eliminated by additional driving paths (in addition to PL1) which can possibly be masked. A character is thus formed having a height of, for example, 2½ mm which is clearly legible (see FIG. 1 for the dimensions of the domains).

FIG. 8 shows a click device and a ratchet device which are realized by the widening and narrowing of the strip provided on the magnetic plate. As long as their diameter amounts to, for example, approximately twice the width of the permalloy strip, the domains are preferably situated in a region where the permalloy strip is widest; consequently, the potential drop for the domains is deeper at that area. The parts 14 of the permalloy strip have a nominal width. As result of the constrictions 7 and 9, a preferred position for a domain is created therebetween. The same applies to the widened portion 6. A given quantity of energy is required for removing a domain from a preferred position. This is the analogue of a clicking mechanism.

In the foregoing, the widened portions and constrictions of the permalloy strip were symmetrical. It is alternatively possible to design these to be asymmetrical. The tapering of the part 15 is very slight, while the part 16, widens abruptly. The energy for transferring a domain from one preferred region 14 to the other is the same in both directions, but the length of the parts (15, 16) differs. Consequently, in the region 15 the return force is smaller that in the part 16. The analogue of a mechanical ratchet is thus realized. Devices according to FIG. 8 can be advantageously used in combination with "cam wheels" according to FIGS. 4 and 5.

In general, it also applies that small irregularities, for example, frays in the edge of the permalloy, cause small irregularities in the potential drop for the domains. Because many domains are present in the same drop these effects will be substantially averaged.

FIG. 9 shows a further detail of a switch (FIGS. 3 and 4). The part of a path or paths covered by a domain 5 is substantially independent of the position of said domain in the vicinity of a switch. Therefore, a continuous region of a comparatively low potential exists for a passing domain, so that the switch as such cannot impede the domain transport. Provided near the switch 12 is a loop 11 which is arranged near one of the paths 2 and 3 and an external magnetic field, caused by a current in the loop, influences the potential field such tha the domains which arrive from the left are distributed over the paths 2 and 3 according to the correct pattern. At a short distance behind the switch 12, the paths 2 and 3 can also be slightly widened so that an additional force to the right occurs for a domain on the relevant path. Also shown is a part 32 of the common path which varies from narrow to wide. As a result, domains 5 are attracted from a source (10) to the switch 12 by an additional force.

The above description concerned a distributing switch. Using a corresponding pattern, be it without the loop 11, a collecting switch can be formed: therein, the domains move from the right to the left in the figure. The use of domains offers many advantages: their inertia is insignificant, so that high speeds and accelerations are possible. With respect to mechanical drive systems, there is a striking absence of wear and noise. The gearwheels can be constructed to be very small and need not be round. The magnetic fields can be produced by permanent magnets. Furthermore, the gearwheels and the like are slightly resilient.

Some application examples will still be described.

1. Scrambler.

Information arrives in the form of a binary coded flow of domains (FIG. 6). By means of one or more diverging switching units which are operated by "cam wheels" and by means of processing units in the converging paths thereof, the information is coded and subsequently combined again to form a double-speared information flow. The reverse operations are performed on the receiving end. By a suitable choice of domain logic, another code can be readily obtained and the number of coding possibilities is substantially unlimited.

2. Tooling machines, for example, numerically controlled copying mills.

These machines involve numerous measuring clocks and reductors which are driven by servomotors. For gearwheels use can alternatively be made of gearwheels with domains according to the invention, the output powers being delivered, for example, by step motors which are controlled by the domains. Very attractive measuring clocks can be realized by laser interferometry and domain gear-wheels.

3. Using a stabilized oscillator and frequency dividers with domain gearwheels and cam discs, a time piece without mechanically moving parts can be realized. The reading can then also be realized by way of domain techniques.

What is claimed is:

1. A device for propagating magnetic bubble domains in a single, substantially homogeneous layer of magnetic material, said layer comprising a first domain path having a shape of a continuous pattern, said layer further comprising a second domain path comprising a sequence of first and second portions, said second portion having a shape of a continuous pattern, external means for driving a plurality of domains along said first portion, said domains driving each other in sequence along said second portion, said second portion furthermore comprising a sequence of a converying section and a diverging section with said first domain path, said first domain path having a third portion located adjacent to and coextensice with part of said second portion between said coverging and diverging sections thereof and extending a distance sufficient to include at least two of said driven domains, said two domains in the part of said second portion constituting a means for constraining there between a domain in said third portion of said first path equal distant from said two domains in said part of said second portion and for driving said domains in said third portion while maintaining said equal-distant relationship.

2. A device as claimed in claim 1, wherein the domains on one of said two paths are arranged to be substantially equidistant.

3. A device as claimed in claim 1, wherein at least one of said two paths forms a closed figure.

4. A device as claimed in claim 1, wherein said first path comprises means for realizing a clicking device in the form of a stable domain position.

5. A device as claimed in claim 1, wherein said first path comprises a symmetrical means for realizing a ratchet device in the form of a stable domain position.

6. A device as claimed in claim 1, wherein said second path comprises a switching unit along which domains can be alternatively driven as a detour about said second portion.

7. A device as claimed in claim 1, wherein said first and second portions cover part of the first path and the entire length of the second path, the number of domains on the first path being smaller than the number of domains on the second path.

8. A device as claimed in claim 1, including means for driving a domain along a portion of a third domain path arranged alongside a fourth portion of said first domain path, said domain driving means comprising a domain which is driven along said fourth portion of said first domain path, but which can slip with respect to domains driven along said second portion of said second domain path.

9. A device as claimed in claim 1, in which said first path forms part of a number of paths which extend together, and includes a pattern generator for generating a domain pattern responsive to an interaction force of the domains driven along said number of paths and by the domains on said second path.

10. A device as claimed in claim 9, wherein the characteristic dimensions of said pattern are proportional to be visually distinguishable.

* * * * *